United States Patent
Hague et al.

(10) Patent No.: US 8,698,227 B2
(45) Date of Patent: Apr. 15, 2014

(54) MESA-TYPE BIDIRECTIONAL SHOCKLEY DIODE

(75) Inventors: Yannick Hague, Mettray (FR); Samuel Menard, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 85 days.

(21) Appl. No.: 13/332,395

(22) Filed: Dec. 21, 2011

(65) Prior Publication Data

US 2012/0161199 A1 Jun. 28, 2012

(30) Foreign Application Priority Data

Dec. 23, 2010 (FR) ...................................... 10 61208

(51) Int. Cl.
*H01L 29/788* (2006.01)

(52) U.S. Cl.
USPC .... 257/322; 257/288; 257/347; 257/E21.042; 257/E21.53; 257/E21.247; 257/E21.267; 257/E21.352; 257/E21.359

(58) Field of Classification Search
USPC ................ 257/288, 322, 260, 279, 347, 349, 257/E21.042, E21.053, E21.32, E21.247, 257/E21.267, E21.352, E21.359
See application file for complete search history.

(56) References Cited

U.S. PATENT DOCUMENTS

| 4,551,353 | A |   | 11/1985 | Hower et al. |   |
|---|---|---|---|---|---|
| 5,274,524 | A | * | 12/1993 | Pezzani et al. | 361/56 |
| 5,468,976 | A | * | 11/1995 | Evseev et al. | 257/177 |
| 5,479,031 | A | * | 12/1995 | Webb et al. | 257/173 |
| 5,986,289 | A | * | 11/1999 | Simmonet | 257/109 |
| 6,407,901 | B1 | * | 6/2002 | Casey et al. | 361/119 |
| 2003/0209724 | A1 |   | 11/2003 | Casey et al. |   |

FOREIGN PATENT DOCUMENTS

| EP | 0 018 730 | A2 | 11/1980 |
| EP | 0 552 905 | A1 | 7/1993 |
| EP | 0552905 | A1 | 7/1993 |
| GB | 2207803 | A | 2/1989 |

OTHER PUBLICATIONS

French Search Report and Written Opinion dated Jul. 22, 2011 from related French Application No. 10/61212.
French Search Report and Written Opinion dated Jun. 7, 2011 from related French Application No. 10/61213.
French Search Report and Written Opinion dated Jul. 19, 2011 from corresponding French Application No. 10/61208.

* cited by examiner

*Primary Examiner* — David Nhu
(74) *Attorney, Agent, or Firm* — Wolf, Greenfield & Sacks, P.C.

(57) ABSTRACT

A mesa-type bidirectional Shockley diode delimited on its two surfaces by a peripheral groove filled with a glassivation including a substrate of a first conductivity type; a layer of the second conductivity type on each side of the substrate; a region of the first conductivity type in each of the layers of the second conductivity type; a buried region of the first conductivity type under each of the regions of the first conductivity type, at the interface between the substrate and the corresponding layer of the second conductivity type, each buried region being complementary in projection with the other; and a peripheral ring under the external periphery of each of the glassivations, of same doping profile as the buried regions.

13 Claims, 2 Drawing Sheets

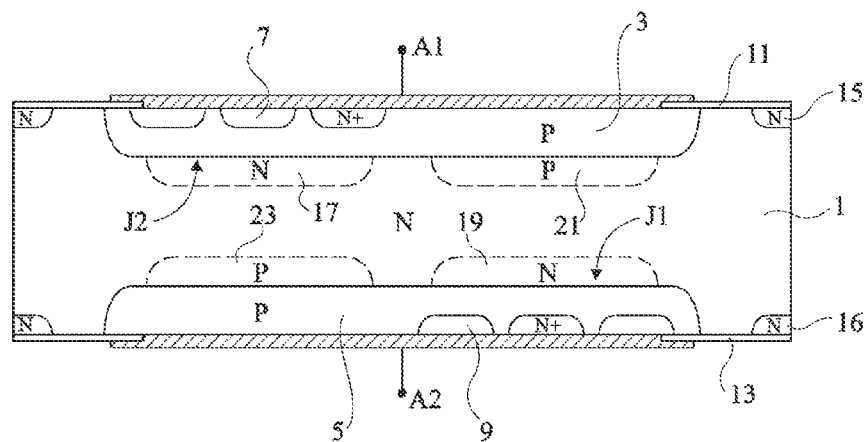
PRIOR ART        Fig 1
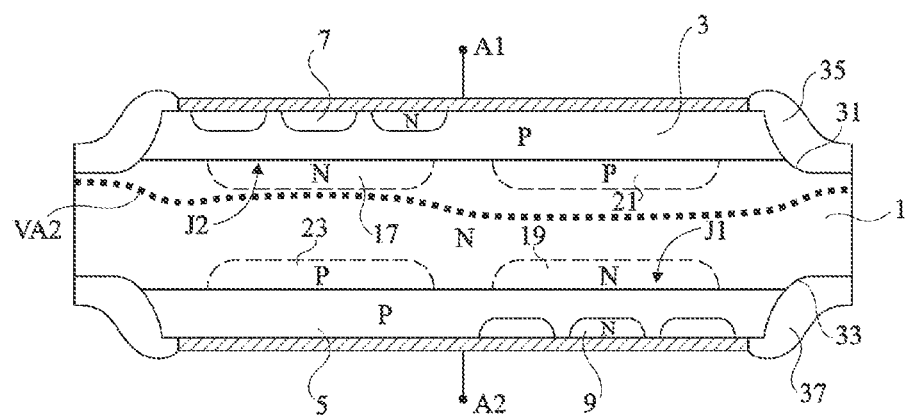
PRIOR ART        Fig 2

MESA-TYPE BIDIRECTIONAL SHOCKLEY DIODE

CROSS REFERENCE TO RELATED APPLICATIONS

This application claims the priority benefit of French patent application number 10/61208, filed on Dec. 23, 2010, entitled MESA-TYPE BIDIRECTIONAL SHOCKLEY DIODE, which is hereby incorporated by reference to the maximum extent allowable by law.

BACKGROUND

1. Technical Field

Embodiments relate to components of protection against overvoltages, and more specifically to a bidirectional Shockley diode.

Two main types of bidirectional Shockley diodes can be distinguished according to the technology used for their manufacturing: planar diodes and mesa diodes.

2. Discussion of the Related Art

FIG. 1 shows an example of a planar-type bidirectional Shockley diode. This device is formed in a lightly-doped N-type substrate 1 (with typically from $10^{14}$ to $10^{15}$ atoms/$cm^3$). A P-type well 3 is formed on the upper surface side and a P-type well 5 is formed on the lower surface side. Usually, these wells are symmetrical and of same doping.

An N-type region 7 is formed in upper well 3 and an N-type region 9 is formed in lower well 5, regions 7 and 9 being heavily doped. Regions 7 and 9 are complementary in projection and substantially of the same surface area. As shown, regions 7 and 9 are generally interrupted by emitter short-circuits.

The component periphery, between the well limit and the chip edge, is coated with an insulating layer, respectively 11 at its upper surface and 13 at its lower surface. Also at the periphery of the structure, at the edge of the chip, heavily-doped N-type rings, respectively 15 at the upper surface and 16 at the lower surface, are used as a channel stop.

The upper surface is coated with a metallization A1 and the lower surface is coated with a metallization A2. When a positive voltage is applied on terminal A1, PNPN Shockley diode 3-1-5-9 is likely to turn on, when the breakdown voltage of the reverse junction between regions 1 and 5 is exceeded. When a positive voltage is applied to terminal A2, PNPN Shockley diode 5-1-3-7 is likely to turn on, when the breakdown voltage of the reverse junction between regions 1 and 3 is exceeded.

To obtain breakdown voltages that are independent of from the substrate doping and to accurately define the volume of the breakdown areas, an N region 17 is arranged in front of upper N region 7 at the interface between well 3 and substrate 1 and an N region 19 is arranged in front of lower N region 9 at the interface between well 5 and substrate 1. N regions 17 and 19 will be called buried regions and for example result from implantations performed before the forming of P wells 3 and 5. Thus, junction J2 between N region 17 and P well 3 and junction J1 between P well 5 and N region 19 determine the breakdown voltages of the device. Optional P-type buried regions 21 and 23 have further been shown in front of N-type buried regions 19 and 17, respectively. Buried regions 21 and 23 aim at decreasing the effective thickness of substrate 1 in each of the Shockley diodes, to decrease the on-state resistance of the protection device.

A bidirectional Shockley diode of planar type such as shown in FIG. 1 provides satisfactory results. However, in many cases, it is preferred for technological reasons to form mesa-type diodes, especially because it is much simpler to form relatively deep P regions (more than 30 μm for diodes adapted to breakdown voltages ranging from 50 to 400 V) with no masking.

FIG. 2 shows an example of a mesa-type bidirectional Shockley diode. To simplify the description, layers similar to those in FIG. 1 have been designated with the same reference numerals. An essential difference is that, instead of forming local P-type wells 3 and 5 on either side of the substrate, uniform P-type layers, also designated with reference numerals 3 and 5, are formed with no masking on both surfaces of the substrate. The diode is delimited by peripheral grooves, respectively 31 on the upper surface side and 33 on the lower surface side, filled with an appropriate insulating material, respectively 35 and 37, currently a glassivation. Grooves cut the junctions between the substrate and P layers 3, 5.

Generally, as compared with a planar-type diode, a mesa-type bidirectional Shockley diode, biased to a voltage smaller than its breakdown voltage, has greater leakage currents. Further, the leakage currents tend to increase during the lifetime of the component when it is submitted to external stress, such as a lengthy biasing and a high temperature. In FIG. 2, equipotential line VA2 when a positive potential difference (VA2-VA1) is applied between electrodes A2 and A1 has been illustrated in bold dotted lines. The technology used to create the mesa groove, its specific geometric shape, and the nature of the passivating materials explain the distribution of the equipotential lines at the edges of the component, as well as their variation in the presence of stress. The electric field thus present at the passivation-silicon interfaces is responsible for the high leakage currents.

Many solutions and mesa-type bidirectional Shockley diode structures have been provided to overcome these disadvantages. However, some known solutions are relatively complex and require either a significant increase in the surface area of the bidirectional Shockley diode, or additional manufacturing steps with respect to those required for the manufacturing of a component such as that illustrated in FIG. 2.

There thus is a need for a simple mesa-type bidirectional Shockley diode with a low leakage current that remains steady along time.

SUMMARY

Thus, an embodiment provides a mesa-type bidirectional Shockley diode which is easy to form and which has low leakage currents, steady along time.

More specifically, an embodiment aims at forming such a bidirectional Shockley diode without increasing the number of steps required to manufacture a bidirectional Shockley diode such as that in FIG. 2.

An embodiment provides a mesa-type bidirectional Shockley diode comprising a substrate of a first conductivity type; a layer of the second conductivity type on each side of the substrate; a region of the first conductivity type in each of the layers of the second conductivity type; a buried region of the first conductivity type under each of said regions of the first conductivity type, at the interface between the substrate and the corresponding layer of the second conductivity type, each buried region being complementary in projection to the other; a peripheral groove filled with the glassivation in each of the surfaces of the diode, each groove crossing the layer of the second conductivity type of the corresponding surface and penetrating into the substrate; and a peripheral ring under the external periphery of each of the grooves, of same doping profile as said buried regions said ring contacting only the groove and the substrate.

According to an embodiment, the first conductivity type is type N and the second conductivity type is type P.

According to an embodiment, the bidirectional Shockley diode comprises buried regions of the second conductivity type, at the interfaces between layers and substrate in front of the buried regions of the first conductivity type.

The foregoing and other objects, features, and advantages will be discussed in detail in the following non-limiting description of specific embodiments in connection with the accompanying drawings.

BRIEF DESCRIPTION OF THE DRAWINGS

FIG. 1, previously described, is a simplified cross-section view of a planar-type bidirectional Shockley diode;

FIG. 2, previously described, is a simplified cross-section view of a mesa-type bidirectional Shockley diode;

For clarity, the same elements have been designated with the same reference numerals in the different drawings and, further, as usual in the representation of electronic components, the various drawings are not to scale.

DETAILED DESCRIPTION

Figure 3:
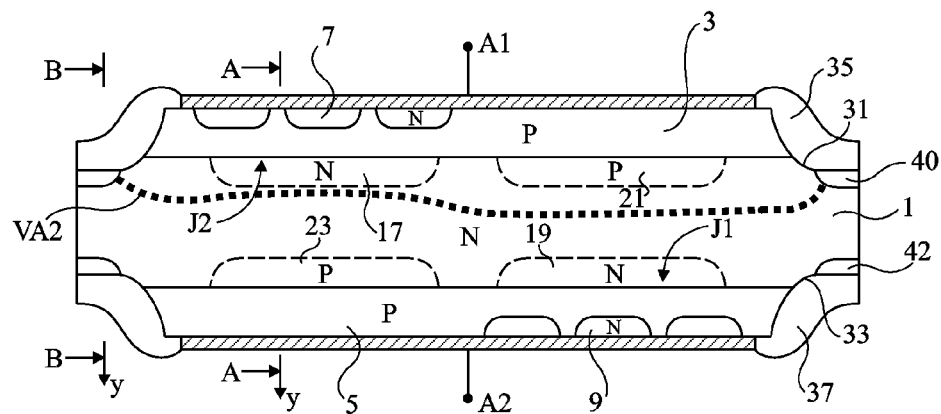
FIG. 3 is a simplified cross-section view of a bidirectional Shockley diode according to an embodiment.

FIG. 3 is a simplified cross-section view of a bidirectional Shockley diode comprising the same elements as those in FIG. 2 and further comprising at the external periphery of the component an N-type peripheral ring 40 on the upper surface side of the substrate under glassivation 35 and an N-type peripheral ring 42 on the lower surface side of the substrate under glassivation 37.

In FIG. 3, equipotential line VA2 when a positive potential difference (VA2-VA1) is applied between electrodes A2 and A1 has been illustrated with bold dotted lines. Rings 40 and 42, more heavily N-type doped than the substrate, oppose the spreading of the equipotential lines and avoid for these to extend to the peripheral sawing area of the component. The effect of activation of the peripheral interface states is thus decreased. Accordingly, the contribution of the component edges to the leakage current and to its variation will be decreased, thus resulting in a significant decrease in the general leakage current as well as in its variation during the component lifetime. It should for example be ascertained that areas 40 and 42 are sufficiently distant from the ends of PN junctions 3-1 and 5-1, respectively.

According to an embodiment, rings 40 and 42 are respectively formed at the same time as N-type buried regions 7 and 9, by simply modifying the mask used to delimit such N-type implantations. Thus, the structure of FIG. 3 is obtained without performing any additional operation with respect to the steps useful to the forming of the structure of FIG. 2.

To better explain the implementation of embodiments, an example of dimensions and doping levels corresponding to a bidirectional Shockley diode having a breakdown voltage of approximately 300 volts will be given.

Figure 4A:
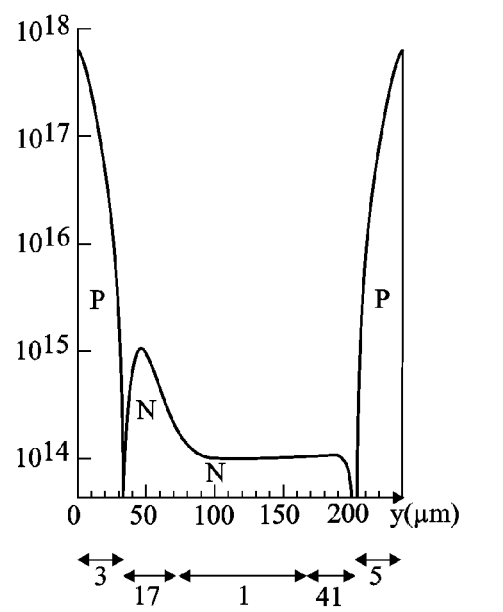
FIGS. 4A and 4B are curves indicating doping levels in directions y of planes AA and BB of FIG. 3.

FIG. 4A shows the distribution of the doping levels in direction y of plane AA of FIG. 3. The component has a total thickness of 240 μm, P layers 3 and 5 have thicknesses of 35 μm, that is, the area taken up by substrate N has a thickness of approximately 170 μm. On the left-hand side of FIG. 4A (upper portion of the component), there is a higher doping level corresponding to buried region 17 of determination of the breakdown voltage. Optional P-type buried region 23 on the lower substrate side has not been shown in this cross-section view.

Figure 4B:
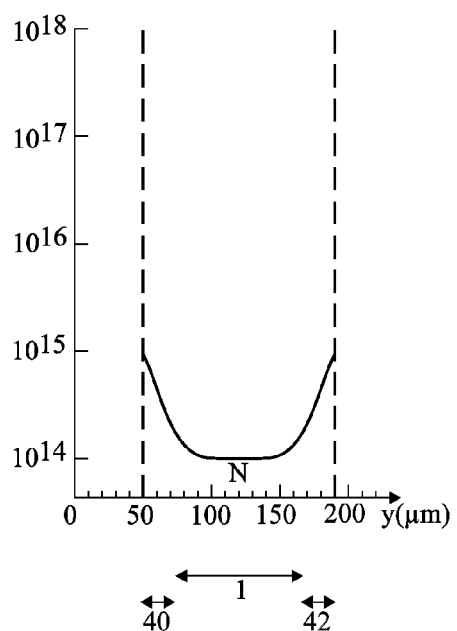

FIG. 4B shows the distribution of the doping levels in direction y of plane BB of FIG. 3, towards the component periphery, at the levels of the external edges of the grooves. It should be noted that the N-type region of substrate 1 doped with $10^{14}$ atoms/cm$^3$ is surrounded with N-type regions doped with approximately $10^{15}$ atoms/cm$^3$ which correspond to rings 40, 42 arranged at the component periphery under the glassivations. FIG. 4A shows that the grooves delimiting the component periphery have a 50-μm thickness, which corresponds to a conventional depth for such grooves. It can thus be seen that the use of the N-type buried regions for determining the avalanche voltage is compatible with the forming of the peripheral rings described herein.

Specific embodiments of the present invention have been described. Various alterations and modifications will occur to those skilled in the art, especially as concerns the thicknesses of the various layers, and the doping levels, which will be adapted to the desired breakdown voltages which will preferably range between 50 and 400 volts.

Any known mesa-type bidirectional Shockley diode may be used, provided for N-type peripheral rings to be formed at the same time (by the same implantation) as N-type buried regions for setting the breakdown voltage.

On the other hand, a component similar to that described herein may be formed by inverting all the conductivity types of the various layers.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A mesa-type bidirectional Shockley diode, comprising:
    a substrate of a first conductivity type;
    a layer of a second conductivity type on a first side and a second side of the substrate;
    a region of the first conductivity type in each of the layers of the second conductivity type;
    a buried region of the first conductivity type under each of said regions of the first conductivity type, at an interface between the substrate and the corresponding layer of the second conductivity type, each buried region being complementary in projection with the other;
    a peripheral groove filled with a glassivation in each of a first surface and a second surface of the mesa-type Shockley diode, each peripheral groove crossing the layer of the second conductivity type of the corresponding surface and penetrating into the substrate; and
    a peripheral ring under an external periphery of each of the peripheral grooves of a same doping profile as said buried regions, said peripheral ring contacting only the peripheral groove and the substrate.

2. The mesa-type bidirectional Shockley diode of claim 1, wherein the first conductivity type is type N and the second conductivity type is type P.

3. The mesa-type bidirectional Shockley diode of claim 1, further comprising:
    buried regions of the second conductivity type at the corresponding interfaces between the layers of the second conductivity type and the substrate adjacent to the buried regions of the first conductivity type.

4. A bidirectional Shockley diode, comprising:
a substrate of a first conductivity type;
a layer of a second conductivity type on a first side of the substrate;
a peripheral groove in a surface of the Shockley diode, the peripheral groove crossing the layer of the second conductivity type of the corresponding surface and penetrating into the substrate;
an insulator on the surface of the Shockley diode covering at least the peripheral groove; and
a peripheral ring of a first conductivity type in the substrate, the peripheral ring comprising an interface with the substrate and an interface with the insulator.

5. The bidirectional Shockley diode of claim 4, wherein a concentration of a dopant of the first conductivity type of the peripheral ring is greater than a concentration of the dopant of the first conductivity type of the substrate.

6. The bidirectional Shockley diode of claim 4, further comprising:
a buried region of the first conductivity type in the substrate, the buried region of the first conductivity type comprising an interface with the substrate and an interface with the layer of the second conductivity type,
wherein at least a portion of the peripheral ring is at the same level within the substrate as the buried region of the first conductivity type.

7. The bidirectional Shockley diode of claim 4, further comprising:
a region of the first conductivity type in the layer of the second conductivity type,
wherein a concentration of a dopant of the first conductivity type of the peripheral ring is substantially equal to a concentration of the dopant of the first conductivity type of the region of the first conductivity type.

8. The bidirectional Shockley diode of claim 4, wherein the first conductivity type is type N and the second conductivity type is type P.

9. The bidirectional Shockley diode of claim 4, further comprising:
a buried region of the second conductivity type in the substrate, the buried region of the second conductivity type comprising an interface with the substrate and an interface with the layer of the second conductivity type.

10. A method of forming a bidirectional Shockley diode, the method comprising acts of:
forming a layer of a second conductivity type on a substrate of a first conductivity type without using a mask;
forming a peripheral groove to delimit the Shockley diode, the peripheral groove crossing the layer of the second conductivity type and penetrating into the substrate;
forming a region of the first conductivity type in the layer of the second conductivity type; and
forming a peripheral ring of a first conductivity type in a portion of the substrate where the peripheral groove penetrated the substrate;
wherein the region of the first conductivity type and the peripheral ring are formed at the same time.

11. The method of claim 10, wherein the region of the first conductivity type is formed by an implantation act that is the same implantation act that forms the peripheral ring.

12. The method of claim 10, wherein the region of the first conductivity type is formed using a mask that is the same mask used to form the peripheral ring.

13. The method of claim 10, wherein the first conductivity type is type N and the second conductivity type is type P.

* * * * *